(12) United States Patent
Hosseini et al.

(10) Patent No.: US 9,305,876 B2
(45) Date of Patent: Apr. 5, 2016

(54) DEVICE INCLUDING A SEMICONDUCTOR CHIP AND WIRES

(71) Applicant: Infineon Technologies Austria AG, Villach (AT)

(72) Inventors: Khalil Hosseini, Weihmichl (DE); Joachim Mahler, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 248 days.

(21) Appl. No.: 13/757,346

(22) Filed: Feb. 1, 2013

(65) Prior Publication Data

US 2014/0218885 A1 Aug. 7, 2014

(51) Int. Cl.
*H05K 7/00* (2006.01)
*H01L 23/50* (2006.01)
(Continued)

(52) U.S. Cl.
CPC ............... *H01L 23/50* (2013.01); *H01L 21/58* (2013.01); *H01L 23/49531* (2013.01); *H01L 23/49562* (2013.01); *H01L 23/49575* (2013.01); *H01L 24/48* (2013.01); *H01L 24/49* (2013.01); *H01L 24/05* (2013.01); *H01L 24/06* (2013.01); *H01L 24/45* (2013.01); *H01L 25/072* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/0603* (2013.01); *H01L 2224/2919* (2013.01); *H01L 2224/45015* (2013.01); *H01L 2224/45124* (2013.01); *H01L 2224/45144* (2013.01); *H01L 2224/45147* (2013.01); *H01L 2224/48091* (2013.01); *H01L 2224/4899* (2013.01); *H01L 2224/48137* (2013.01);

(Continued)

(58) Field of Classification Search
CPC ..................... H05K 1/141; H01L 2924/01078; H01L 2924/01079; H01L 2224/16
USPC .................. 361/760, 748, 767, 803, 764; 174/250–262
See application file for complete search history.

(56) References Cited

U.S. PATENT DOCUMENTS 3,621,307 A * 11/1971 Raven et al. .................. 327/517
5,954,526 A * 9/1999 Smith ........................... 439/136

(Continued)

FOREIGN PATENT DOCUMENTS

JP 0010126206 A * 5/1998
JP 2003142689 A * 5/2003

OTHER PUBLICATIONS (Machine Translation of JP 2003142689 A) Arai, Semiconductor Device.*

(Continued)

*Primary Examiner* — Yuriy Semenenko
(74) *Attorney, Agent, or Firm* — Slater & Matsil, L.L.P.

(57) ABSTRACT

A device includes a carrier, a first semiconductor chip arranged over the carrier and a first electrically conductive element arranged over the carrier. The device further includes a first wire electrically coupled to the first electrically conductive element and a second wire electrically coupled to the first electrically conductive element and to the first semiconductor chip. The first electrically conductive element is configured to forward an electrical signal between the first wire and the second wire.

19 Claims, 8 Drawing Sheets

(51) Int. Cl.
*H01L 21/58* (2006.01)
*H01L 23/00* (2006.01)
*H01L 23/495* (2006.01)
*H01L 25/07* (2006.01)

(52) U.S. Cl.
CPC .......... *H01L2224/48247* (2013.01); *H01L 2224/48624* (2013.01); *H01L 2224/48639* (2013.01); *H01L 2224/48644* (2013.01); *H01L 2224/48647* (2013.01); *H01L 2224/48655* (2013.01); *H01L 2224/48664* (2013.01); *H01L 2224/48666* (2013.01); *H01L 2224/48669* (2013.01); *H01L 2224/48671* (2013.01); *H01L 2224/48724* (2013.01); *H01L 2224/48739* (2013.01); *H01L 2224/48744* (2013.01); *H01L 2224/48747* (2013.01); *H01L 2224/48755* (2013.01); *H01L 2224/48764* (2013.01); *H01L 2224/48766* (2013.01); *H01L 2224/48769* (2013.01); *H01L 2224/48771* (2013.01); *H01L 2224/48824* (2013.01); *H01L 2224/48839* (2013.01); *H01L 2224/48844* (2013.01); *H01L 2224/48847* (2013.01); *H01L 2224/48855* (2013.01); *H01L 2224/48864* (2013.01); *H01L 2224/48866* (2013.01); *H01L 2224/48869* (2013.01); *H01L 2224/48871* (2013.01); *H01L 2224/4903* (2013.01); *H01L 2224/4911* (2013.01); *H01L 2224/49113* (2013.01); *H01L 2924/07802* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01); *H01L 2924/1461* (2013.01); *H01L 2924/15787* (2013.01); *H01L 2924/181* (2013.01); *H01L 2924/19107* (2013.01)

(56) References Cited

U.S. PATENT DOCUMENTS

| | | | | |
|---|---|---|---|---|
| 6,803,666 | B2* | 10/2004 | Takahashi et al. | 257/784 |
| 6,841,421 | B2* | 1/2005 | Aono et al. | 438/121 |
| 7,755,255 | B2* | 7/2010 | Saito et al. | 310/334 |
| 2009/0095508 | A1* | 4/2009 | Park et al. | 174/250 |
| 2011/0011939 | A1* | 1/2011 | Seah | 235/492 |

OTHER PUBLICATIONS

Cook, Intermediate Robot Building, Apress Paul Manning, Second Edition, p. 204.*

* cited by examiner

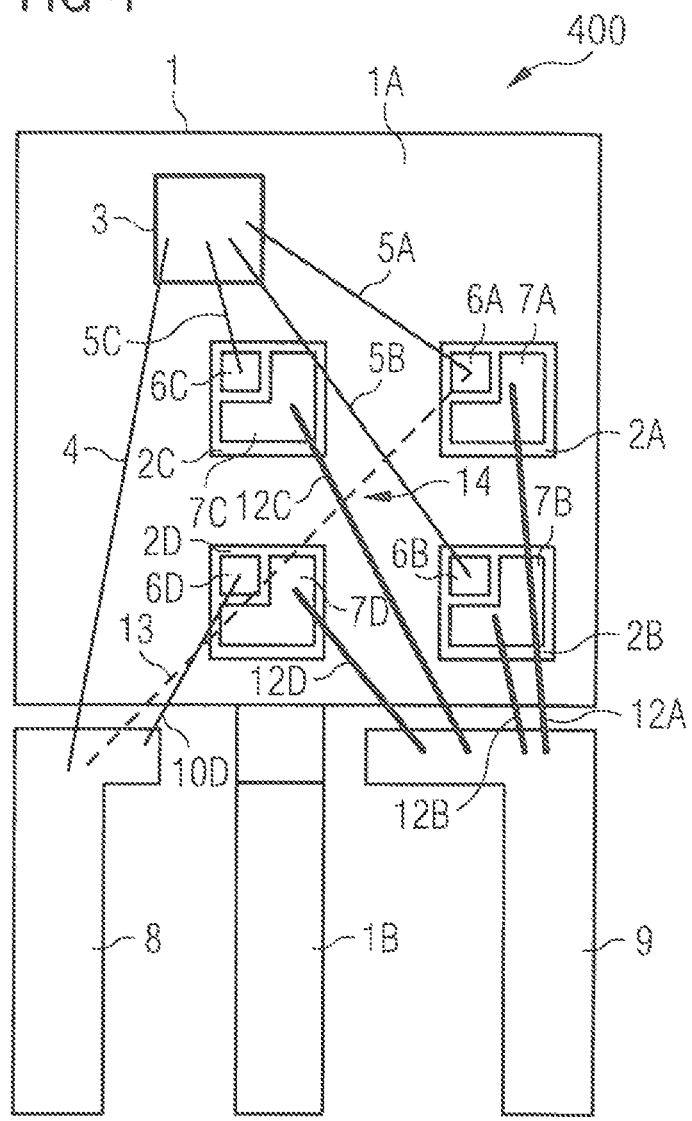

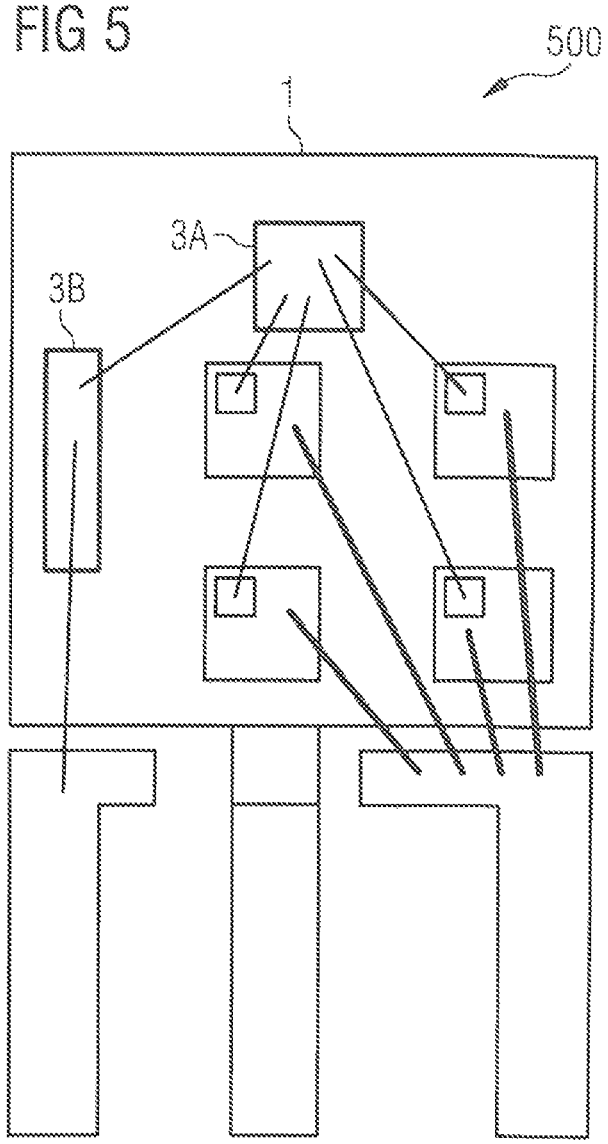

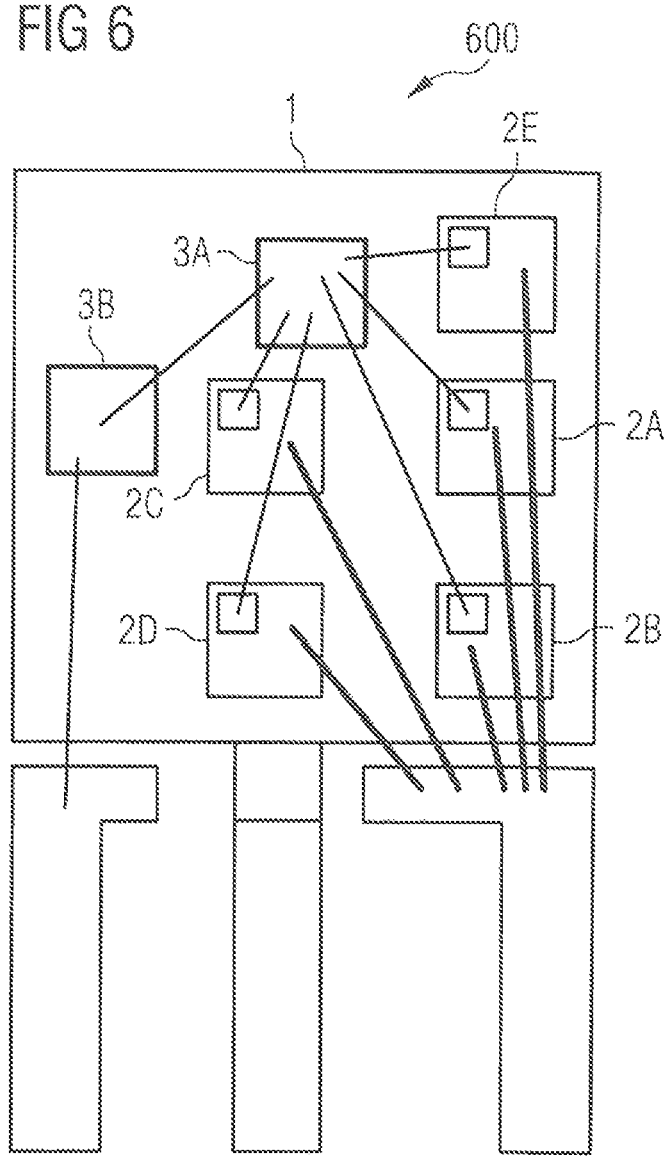

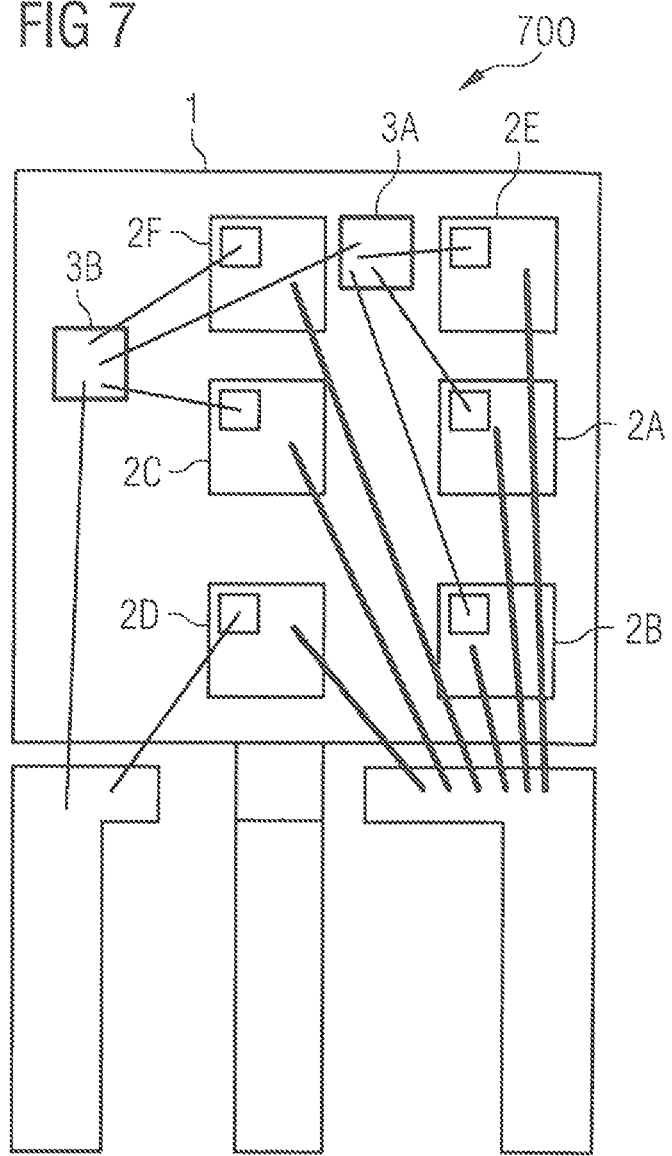

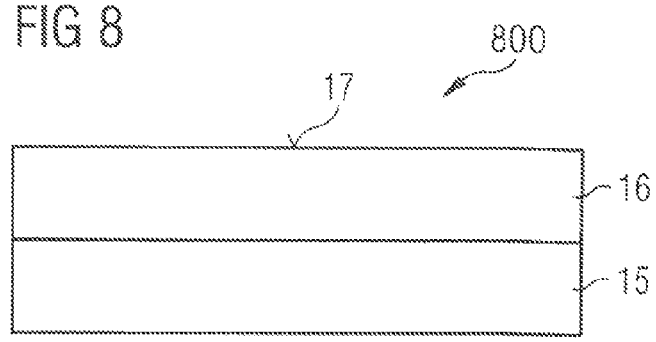
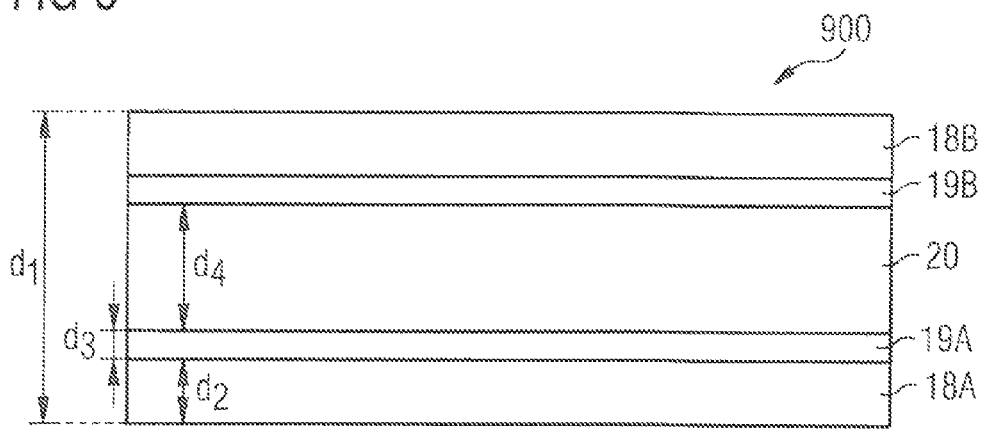

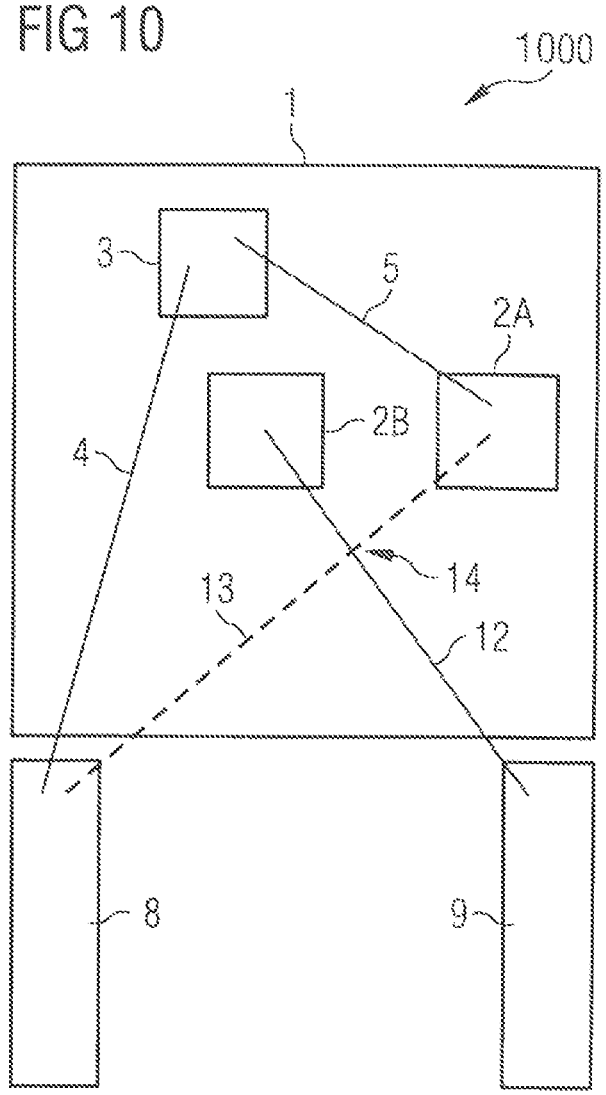

DEVICE INCLUDING A SEMICONDUCTOR CHIP AND WIRES

TECHNICAL FIELD

This invention relates to devices including a semiconductor chip and wires. The invention further relates to methods for manufacturing such devices.

BACKGROUND

Electronic devices may include one or more semiconductor chips. The semiconductor chips may be electrically connected to wires. Devices and methods for manufacturing devices constantly have to be improved. It may be desirable to improve a performance and a quality of the devices. In particular, it may be desirable to avoid unwanted effects like shorts during an operation of the devices.

SUMMARY

In accordance with an embodiment of the present invention, a device comprises a carrier, a first semiconductor chip arranged over the carrier, a first electrically conductive element arranged over the carrier, a first wire electrically coupled to the first electrically conductive element, a second wire electrically coupled to the first electrically conductive element and to the first semiconductor chip, wherein the first electrically conductive element is configured to couple an electrical signal between the first wire and the second wire. The first electrically conductive element of the device includes a layer stack, wherein the layer stack comprises a first electrically conductive layer arranged over the carrier, and wherein the first electrically conductive layer is electrically coupled to the carrier, an electrically insulating layer arranged over the first electrically conductive layer and a second electrically conductive layer arranged over the electrically insulating layer, wherein the second electrically conductive layer is electrically coupled to at least one of the first wire and the second wire.

An advantage of some embodiments of the present invention is that an optical short between different wires can be avoided.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

FIG. 4 schematically illustrates a top plan view of a device 400 in accordance with the disclosure;

FIG. 5 schematically illustrates a top plan view of a device 500 in accordance with the disclosure;

FIG. 6 schematically illustrates a top plan view of a device 600 in accordance with the disclosure;

FIG. 7 schematically illustrates a top plan view of a device 700 in accordance with the disclosure;

FIG. 8 schematically illustrates a cross-sectional view of an electrically conductive element 800 in accordance with the disclosure;

FIG. 9 schematically illustrates a cross-sectional view of an electrically conductive element 900 in accordance with the disclosure; and FIG. 10 schematically illustrates a top plan view of a device 1000 in accordance with the disclosure.

DETAILED DESCRIPTION OF ILLUSTRATIVE EMBODIMENTS

Figure 1:
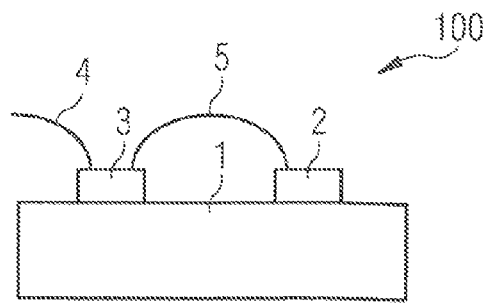
FIG. 1 schematically illustrates a cross-sectional view of a device 100 in accordance with the disclosure.
Figure 2A:
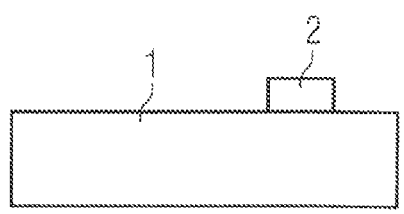
FIGS. 2A to 2D schematically illustrate a cross-sectional view of a method for manufacturing a device 200 in accordance with the disclosure.
Figure 2B:
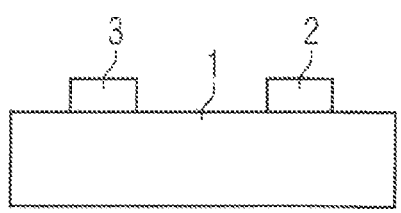
Figure 2C:
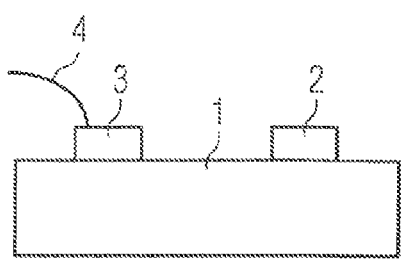
Figure 2D:
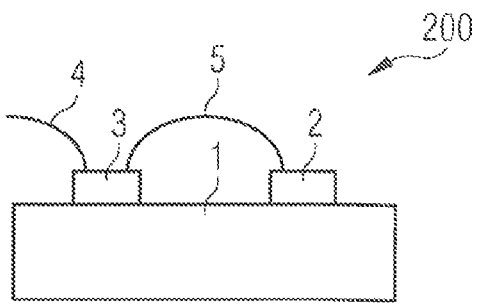

In the following detailed description, reference is made to the accompanying drawings, which form a part hereof, and in which is shown by way of illustration specific aspects in which the invention may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present invention. The following detailed description, therefore, is not to be taken in a limiting sense, and the scope of the present invention is defined by the appended claims.

As employed in this specification, the terms "coupled" and/or "electrically coupled" are not meant to mean that the elements must be directly coupled together. Intervening elements may be provided between the "coupled" or "electrically coupled" elements.

Devices and methods for manufacturing such devices are described herein. It is understood that comments made in connection with a described device may also hold true for a corresponding method and vice versa. For example, if a specific component of a device is described, a corresponding method for manufacturing the device may include a step of providing the component in a suitable manner, even if such a method step is not explicitly described or illustrated in the figures. In addition, it is understood that the features of the various exemplary aspects described herein may be combined with each other, unless specifically noted otherwise.

The devices described herein may include a carrier, over (or on) which a semiconductor chip may be arranged. The carrier may be manufactured of a metal, an alloy, a dielectric, a plastic, a ceramic or a combination thereof. The carrier may have a homogeneous structure, but may also provide internal structures like conducting paths with an electric redistribution function. Examples for such carriers are a die pad, a lead frame including a die pad, or a ceramic substrate including one or more redistribution layers.

The devices described herein may include one or more semiconductor chips. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. In addition, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, magnetic field sensors, electro-magnetic field sensors, microphones etc. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

For example, the semiconductor chips may be or may include one or more power semiconductor chips. The semiconductor chips may have a vertical structure, i.e., the semiconductor chips may be fabricated in such a way that electric currents may flow in a direction perpendicular to the main faces of the semiconductor chips. A semiconductor chip having a vertical structure may have electrodes on its two main faces, i.e., on its top side and bottom side. In particular, power semiconductor chips may have a vertical structure and may have load electrodes on both main faces. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors) or power bipolar transistors. For example, the source electrode and gate electrode of a power MOSFET may be situated on one face, while the drain electrode of the power MOSFET may be arranged on the other face. In addition, the devices described herein may include integrated circuits to control the integrated circuits of the power semiconductor chips.

The semiconductor chips may have contact pads (or contact elements or contact terminals or contact electrodes) which may allow electrical contact to be made with integrated circuits included in the semiconductor chips. For the case of a power semiconductor chip, a contact pad may, e.g., correspond to a gate electrode or a source electrode. The contact pads may include one or more metal layers that may be applied to the semiconductor material. The metal layers may be manufactured with any desired geometric shape and any desired material composition. Any desired metal or metal alloy, for example, aluminum, titanium, gold, silver, copper, palladium, platinum, nickel, chromium or nickel vanadium, may be used as the material. The metal layers need not be homogenous or manufactured from just one material, i.e., various compositions and concentrations of the materials contained in the metal layers may be possible.

The devices described herein may include a wire, in particular a bond wire or bonding wire. The wire may include a metal or a metal alloy, in particular gold, aluminum, copper, or one or more of their alloys. In addition, the wire may or may not include a coating. The wire may have a substantially circular cross section such that the term "thickness" of the wire may refer to the diameter of the bond wire. However, it is understood that the wire may also have a cross section of different and arbitrary form. In general, the wire may have a thickness from about 15 μm (micrometers) to about 1000 μm (micrometers), and more particular a thickness of about 50 μm (micrometers) to about 500 μm (micrometers).

In a first more particular example, the wire may have a thickness smaller than 75 μm (micrometers), for example a thickness from about 50 μm (micrometers) to about 75 μm (micrometers). Such wire may particularly include or be made of aluminum. The wire may include further materials, for example up to 1% silicon. For example, such wire may provide an electrical connection between a contact element and a gate electrode of a power semiconductor chip and/or between gate electrodes of two different power semiconductor chips. In a second more particular example, the wire may have a thickness from about 125 μm (micrometers) to about 500 μm (micrometers). Such wire may be particularly employed to provide an electrical connection between a contact element and a source electrode of a power semiconductor chip.

The semiconductor chips may be covered with an encapsulation material which may be electrically insulating and may form an encapsulation body. The encapsulation material may include any appropriate duroplastic, thermoplastic or thermosetting material, mold compound, or laminate (prepreg). Various techniques may be used to encapsulate the semiconductor chips with the encapsulation material, for example compression molding, injection molding, powder molding, liquid molding, or lamination.

In the following, the term "forwarding" an electrical signal may be used. Forwarding an electrical signal may leave a strength of the electrical signal and/or a shape of the electrical signal substantially unchanged. The electrical signal may be not intentionally processed or altered by an (electronic) structure of a component used for forwarding the electrical signal. That is, no (electronic) structure (even if present) configured to process electrical signals is used to process or alter the electrical signal. It is understood that an unwanted change of a strength and/or a shape of a signal may occur during forwarding the signal, for example due to an inherent electrical resistance of the electrically conductive element. However, such altering of the signal does not correspond to an intentional processing of the electrical signal. In one example, an electrically conductive element may be used to forward an electrical signal from a first wire to a second wire, wherein both wires may be electrically coupled to the electrically conductive element. Detailed examples of electrically conductive elements are provided below.

FIG. 1 schematically illustrates a cross-sectional view of a device 100 in accordance with the disclosure. The device 100 includes a carrier 1, a semiconductor chip 2 arranged over the carrier 1 and an electrically conductive element 3 arranged over the carrier 1. The device 100 further includes a first wire 4 electrically coupled to the electrically conductive element 3 and a second wire 5 electrically coupled to the electrically conductive element 3 and to the semiconductor chip 2. The first wire 4 may be coupled to further components (not illustrated). The electrically conductive element 3 is configured to forward an electrical signal between the first wire 4 and the second wire 5. It is noted that more detailed devices similar to the device 100 as well as exemplary structures of the electrically conductive element 3 are described below.

FIGS. 2A to 2D schematically illustrate a cross-sectional view of a method for manufacturing a device 200 in accordance with the disclosure. In a first step (see FIG. 2A), a semiconductor chip 2 is arranged over a carrier 1. In a second step (see FIG. 2B), an electrically conductive element 3 is arranged over the carrier 1. In a third step (see FIG. 2C), a first wire 4 is electrically coupled to the electrically conductive element 3. In a fourth step (see FIG. 2D), a second wire 5 is electrically coupled to the electrically conductive element 3 and the semiconductor chip 2. The electrically conductive element 3 is configured to forward an electrical signal between the first wire 4 and the second wire 5. It is noted that methods for manufacturing devices similar to the device 200 become apparent from the following specification.

Figure 3A:
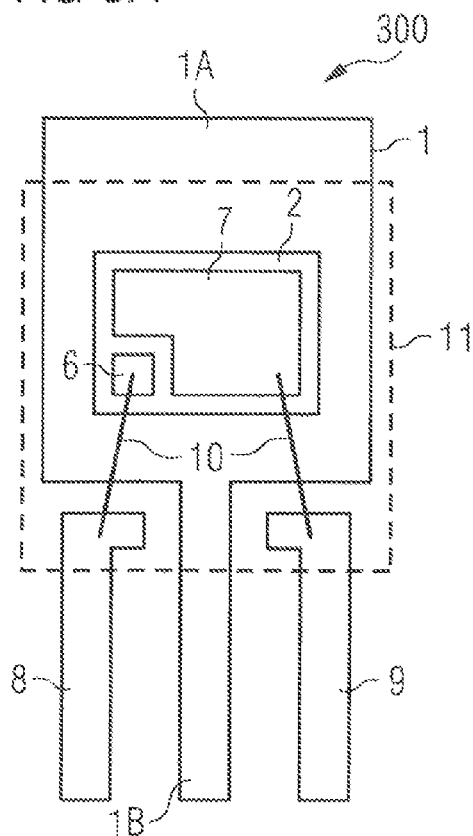
FIG. 3A schematically illustrates a top plan view of a device 300.
Figure 3B:
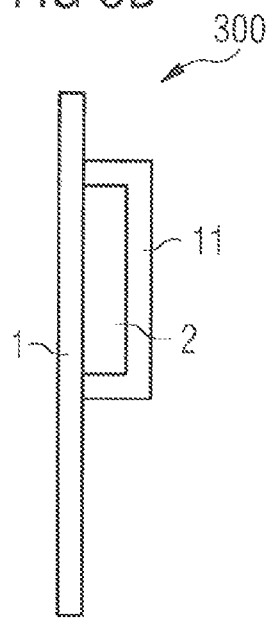
FIG. 3B schematically illustrates a cross-sectional view of the device 300.

FIG. 3A schematically illustrates a top plan view of a device 300. FIG. 3B illustrates the device 300 in a cross-sectional side view. FIGS. 3A and 3B are meant to support an understanding of devices in accordance with the disclosure. Comments made in connection with FIGS. 3A and 3B may also hold true for devices in accordance with the disclosure as described herein.

The device 300 may include a carrier 1 having a die pad 1A that may at least partly be made of an arbitrary electrically conductive material, for example a metal or a metal alloy. In addition, the carrier 1 may be manufactured to have a contact element 1B having the form of a terminal leg. The contact element 1B may at least partly be made of an electrically conductive material too. For example, the die pad 1A and the contact element 1B may be made of the same material and may have been fabricated in one piece, i.e., formed integrally.

The device 300 may further include a power semiconductor chip 2, e.g., a transistor chip, arranged over or mounted on the die pad 1A. A surface of the transistor chip 2 facing away from the die pad 1A may be defined as a top side of the transistor chip 2, and a surface opposite to the top side may be defined as a bottom side of the transistor chip 2. The bottom side of the transistor chip 2 may represent a drain electrode (not illustrated), while the top side of the transistor chip 2 may include a gate electrode 6 and a source electrode 7.

The transistor chip 2 may be mounted with its bottom side on the die pad 1A. Since the die pad 1A and the contact element 1B may be electrically coupled, it may be possible to contact the drain electrode of the transistor chip 2 via the contact element 1B. The device 300 may include two further contact elements 8, 9 that may be formed as terminal legs. The contact elements 8, 9 may at least partly be made of an arbitrary electrically conductive material, for example a metal or a metal alloy. In one example, the material of the contact elements 8, 9 may be similar to or may coincide with the material of the die pad 1 and/or the contact element 1B.

The transistor chip 2 may be covered by a mold compound II (see dashed line) wherein the three contact elements 1B, 8 and 9 may protrude out of the mold compound II. The contact elements 1B, 8 and 9 may provide an electrical connection to possible external applications that may be configured to use the transistor chip 2. The contact element 1B may constitute the drain terminal, while the two other contact elements 8 and 9 may be connected to the gate electrode 6 and the source electrode 7, respectively, by means of wires 10. In particular, an electrical signal received at the contact element 8 from an external application may control a current between the source electrode 7 and the drain electrode (not illustrated) of the transistor chip 2. For example, the electrical signal may be a voltage signal in a range from about 2 Volts to about 4 Volts.

FIG. 4 schematically illustrates a top plan view of a device 400 in accordance with the disclosure. A sectional side view of the device 400 may be derived using FIGS. 3A and 3B that illustrate a top plan view and a cross-sectional side view of a similar device 300. The device 400 may include similar components as device 300 such that comments made in connection with FIG. 3 may also hold true for FIG. 4.

The device 400 may include a die pad 1A and contact elements 1B, 8, 9 that have already been described in connection with FIG. 3. Four semiconductor chips 2A to 2D, e.g., transistor chips, may be mounted on the die pad 1A. Each of the transistor chips 2A to 2D may include a gate electrode 6A to 6D on its top side, a source electrode 7A to 7D on its top side, and a drain electrode (not illustrated) on its bottom side, respectively. It is understood that the device 400 may include additional semiconductor chips (not illustrated) depending on its functionality. The device 400 may further include an electrically conductive element 3 mounted on the die pad 1A.

It is noted that detailed exemplary structures of the electrically conductive element 3 are provided below.

The device 400 may include multiple wires that may be arranged and electrically connected to components of the device 400 as illustrated in FIG. 4. It is to be noted than any suitable technique may be used to provide an electrical connection between an end part of a wire and a component of the device 400. For example, an electrical connection may be provided by employing ball bonding, wedge bonding, etc.

Four wires 12A to 12D may provide an electrical connection between the contact element 9 and the source electrodes 7A to 7D of the transistor chips 2A to 2D, respectively. For example, the wires 12A to 12D may be of a type as described above having a thickness from about 125 μm (micrometers) to about 500 μm (micrometers). A wire 10D may provide an electrical connection between the contact element 8 and the gate electrode 6D of the transistor chip 2D. A further wire 4 may provide an electrical connection between the contact element 8 and the electrically conductive element 3. Three wires 5A to 5C may provide an electrical connection between the electrically conductive element 3 and the gate electrodes 6A to 6C of the transistor chips 2A to 2C, respectively. For example, the wires 4, 5A to 5C, 10D may be of a type as described above having a thickness smaller than 75 μm (micrometers), for example a thickness from about 50 μm (micrometers) to about 75 μm.

In FIG. 4, the wires of the device 400 are illustrated as lines extending in the drawing plane (or projection plane). It is understood that each wire may also extend in a direction perpendicular to the drawing plane. A line indicating a wire may be seen as a geometric projection of the three-dimensionally extending wire onto the drawing plane. In other words, a line indicating a wire may correspond to a 3D projection, i.e., a mapping of a three-dimensional object to a two-dimensional plane. In this connection, it is noted that the die pad 1A (or at least a main surface of the die pad 1A) may substantially be arranged in the drawing plane. A line indicating a wire may thus also be seen as a geometric projection of the 3D wire onto the die pad 1A. Since FIG. 4 corresponds to a top plan view of the device 400, the geometric projection may particularly be perpendicular to the drawing plane.

During an operation of the device 400 an electrical signal (e.g., a voltage signal) may be received at the contact element 8, for example from an external application. The electrical signal may be transmitted via the wire 10D to the gate electrode 6D of the transistor chip 2D and may control a current between the source electrode 7D and the drain electrode of the transistor chip 2D. In addition, the electrical signal may be transmitted via the wire 4 to the electrically conductive element 3. The electrically conductive element 3 may forward the electrical signal to each of the gate electrodes 6A to 6C of the transistor chips 2A to 2C via the wires 5A to 5C, respectively. It is noted that the electrical signal received at the contact element 8 and the electrical signal received at each of the gate electrodes 6A to 6C may be (substantially) identical. In particular, the wires 4, 5A to 5C and the electrically conductive element 3 may be not configured to alter a characteristic of the electric signal, for example a signal strength, a signal phase, a signal shape, etc. It is understood that inherent properties of the wires 4, 5A to 5C and the electrically conductive element 3, for example an inherent electrical resistance, may result in an alteration of the electrical signal that may be inevitable. However, such alteration may not necessarily lead to a deviation between an intended control of the transistor chips 2A to 2C and an actually operation of the transistor chips 2A to 2C.

Each of the gate electrodes 6A to 6D may receive a similar signal that may correspond to the signal received at the contact element 8. In this exemplary case, one single electrical signal may be used to control all four transistor chips 2A to 2D. It is noted that the device 400 may include one or more further electrical contacts similar to the contact element 8 and one or more further electrically conductive elements similar to the electrically conductive element 3 that may be arranged such that at least two of the gate electrodes 6A to 6C may receive different electrical signal. It is understood that the number and arrangement of such additional components may depend on the respective functionality of the device 400.

For example, the device 400 may include a further contact element (not illustrated) similar to the contact element 8. This further contact element may receive an electrical signal that may be transmitted/forwarded from the additional contact element to one of the gate electrodes 6A to 6C via an additional wire (not illustrated) and an (optional) additional electrically conductive element (not illustrated). The electrical signal received at the additional contact element may differ from the electrical signal received at the contact element 8 such that at least two of the transistor chips 2A to 2C may be controlled by different signals.

In FIG. 4, there are no intersections between the geometric projections of the wires onto the drawing plane (or onto the die pad 1A). An intersection between two such lines, each indicating a respective wire, may be referred to as "optical short" or "optical short circuit." In other words, the device 400 is free of optical shorts between the wires included therein. It is noted that an optical short between two wires does not necessarily correspond to an actual physical contact between the wires. The lines indicating the wires may intersect in the projection plane, but the wires may extend on different levels perpendicular to the projection plane. Even though an optical short between two wires may not necessarily result in a physical contact between the wires, such optical short may nevertheless result in an undesirable effect during an operation of the device. In particular, such undesirable effects may occur in power semiconductor devices exhibiting strong currents during an operation.

It may also be possible to receive an electrical signal at the contact element 8 and transmit the electrical signal directly from the contact element 8 to the gate electrode 6A of the transistor chip 2A. For this purpose, a wire extending along a virtual straight line 13 between the contact element 8 and the gate electrode 6A may be used. An employment of such wire would result in an optical short 14 between this wire and the wire 12C. From FIG. 4 it becomes apparent that the optical short 14 may be avoided due to the usage of the electrically conductive element 3. The electrically conductive element 3 may redirect the route of the electrical signal between the contact element 8 and the gate electrode 6A, thereby avoiding the optical short 14. It is understood that the usage of the electrically conductive element 3 may avoid further optical shorts which are not explicitly described for the sake of simplicity.

It is understood that the device 400 may include one or more further electrically conductive elements for redirecting the routes of electrical signals occurring during an operation of the device 400 in order to avoid optical shorts. It is noted that the number of the electrically conductive elements may be arbitrary and may particularly depend on a design and/or a functionality of the device 400. In addition, the geometric form of the electrically conductive elements, for example a footprint, a height, a lateral dimension, may be arbitrary too.

FIG. 5 schematically illustrates a top plan view of a device 500 in accordance with the disclosure. The device 500 may be similar to the device 400 of FIG. 4. Comments made in connection with FIG. 4 may thus also hold true for FIG. 5. While FIG. 4 merely illustrates one electrically conductive element 3, the device 500 may include two electrically conductive elements 3A, 3B. Again, the conductive elements 3A, 3B may be arranged over the carrier 1 such that the device 500 may be free of optical shorts. As can be seen from FIG. 5, the electrically conductive elements 3A, 3B may differ in their geometric form, for example with respect to their individual footprints.

FIG. 6 schematically illustrates a top plan view of a device 600 in accordance with the disclosure. The device 600 may be similar to each of the devices 400 and 500. Comments made in connection with previous figures may also hold true for FIG. 6. The device 600 may include five transistor chips 2A to 2E and two electrically conductive elements 3A, 3B arranged over the carrier 1. Again, optical shorts may be avoided due to the illustrated arrangement of the components.

FIG. 7 schematically illustrates a top plan view of a device 700 in accordance with the disclosure. The device 700 may be similar to other devices in accordance with the disclosure. Comments made in connection with foregoing figures may also hold true for FIG. 7. The device 700 includes six transistor chips 2A to 2F and two electrically conductive elements 3A, 3B arranged over the carrier 1. Again, optical shorts may be avoided due to the arrangement of the components.

FIG. 8 schematically illustrates a cross-sectional view of an electrically conductive element 800 in accordance with the disclosure. The electrically conductive element 800 may also be referred to as bond terminal, bond pad, bond island, electrically conductive terminal, electrically conductive pad, electrically conductive island, or electrically conductive bond island. The electrically conductive element 800 may be used in connection with any device in accordance with the disclosure. In particular, any of the electrically conductive elements 3 of the devices previously described may be similar to the electrically conductive element 800.

The electrically conductive element 800 may include an electrically insulating layer 15 and an electrically conductive layer 16 arranged over the electrically insulating layer 15. Referring back to foregoing figures, the electrically conductive element 800 may be mounted on a carrier (or a die pad) such that the electrically insulating layer 15 may face the carrier. In such case, the electrically insulating layer 15 may electrically insulate the carrier from the electrically conductive layer 16.

The electrically insulating layer 15 may be fabricated from any suitable electrically insulating material and may have an arbitrary shape and/or footprint and/or dimension. A footprint of the electrically insulating layer 15 may, e.g., be quadratic, rectangular, circular, etc. For example, the electrically insulating layer 15 may include an adhesive material which may be configured to electrically insulate the electrically conductive element 800 from a carrier the electrically conductive element 800 is mounted on and further to adhere the electrically conductive element 800 to the carrier. Such adhesive layer may have thickness of about 10 μm (micrometers) to about 50 μm (micrometers).

The electrically conductive layer 16 may be used for forwarding an electrical signal as described above. The electrically conductive layer 16 may be fabricated from any suitable electrically conductive material. For example, the electrically conductive layer 16 may be fabricated from an arbitrary metal, an arbitrary metal alloy or a combination thereof. In particular, the electrically conductive layer 16 may be fabricated from a material providing an improved bonding of a wire to the electrically conductive layer 16. In this regard, a material of the electrically conductive layer 16 and a wire bonded thereto may depend on each other such that an improved contact and/or adhesion between these components is provided.

The electrically conductive layer 16 may have an arbitrary shape and/or footprint and/or dimension. In particular, the footprint of the electrically conductive layer 16 may be similar to the footprint of the electrically insulating layer 15. For example, an area of a main surface 17 of the electrically conductive layer 16 may lie in a range from about 0.1 square millimeters to about 10 square millimeters. More particular, an area of the main surface 17 may lie in a range from about 0.25 square millimeters to about 5 square millimeters. Even more particular, an area of the main surface 17 may lie in a range from about 0.5 square millimeters to about 2 square millimeters.

FIG. 9 schematically illustrates a cross-sectional view of an electrically conductive element 900 in accordance with the disclosure. The electrically conductive element 900 may be similar to the electrically conductive element 800 of FIG. 8. Comments made in connection with FIG. 8 may thus also hold true for FIG. 9.

The electrically conductive element 900 may have the form of a layer stack. For example, the layer stack may include multiple layers, as illustrated in FIG. 9, namely: a first electrically conductive layer 18A, a first electrically insulating layer 19A, an intermediate layer 20, a second electrically insulating layer 19B, and a second electrically conductive layer 18B. Referring back to previous figures, the electrically conductive element 900 may be mounted on a carrier (or a die pad) such that one of the first electrically conductive layer 18A or the second electrically conductive layer 18B may face the carrier. A thickness $d_1$ of the electrically conductive element 900 may lie in a range from about 100 µm (micrometers) to about 800 µm (micrometers).

The first electrically conductive layer 18A may particularly be configured to provide an improved bonding of a wire to the electrically conductive layer 18A and/or and improved connection between a carrier (not illustrated) and the electrically conductive layer 18A. For example, the first electrically conductive layer 18A may be manufactured from or may include a metal or a metal alloy. A thickness $d_2$ of the first electrically conductive layer 18A may lie in a range from about 0.5 µm (micrometers) to about 50 µm (micrometers), and more particular in a range from about 5 µm (micrometers) to about 20 µm (micrometers).

The first electrically insulating layer 19A may particularly be configured to provide an electrical insulation between the electrically conductive layers 18A, 18B and/or between one of these layers and further components (not illustrated). For example, the first electrically insulating layer 19A may be manufactured from or may include a silicon oxide, in particular $SiO_2$. A thickness $d_3$ of the first electrically insulating layer 19A may lie in a range from about 0.2 µm (micrometers) to about 2 µm (micrometers).

For example, the intermediate layer 20 may be made of or may include silicon. Possible values for a thickness $d_4$ of the intermediate layer 20 may be derived from possible values for $d_1$, $d_2$, $d_3$ given above.

Comments made in connection with the first electrically conductive layer 18A and the first electrically insulating layer 19A may also hold true for the second electrically conductive layer 18B and the second electrically insulating layer 19B, respectively.

FIG. 10 schematically illustrates a top plan view of a device 1000 in accordance with the disclosure. The device 1000 includes a carrier 1, a first semiconductor chip 2A arranged over the carrier 1 and a second semiconductor chip 2B arranged over the carrier 1. The device 1000 further includes an electrically conductive element 3 arranged over the carrier 1, a first contact element 8 and a second contact element 9. A first wire 4 is electrically coupled to the electrically conductive element 3 and the first contact element 8. A second wire 5 is electrically coupled to the electrically conductive element 3 and the first semiconductor chip 2A. Further, a third wire 12 is electrically coupled to the second semiconductor chip 2B and the second contact element 9. A geometric projection of the first wire 4 onto the carrier 1, a geometric projection of the second wire 5 onto the carrier 1, and a geometric projection of the third wire 12 onto the carrier 1 are free of intersections. Further, a geometric projection of a virtual straight line 13 between the first contact element 8 and the first semiconductor chip 2A onto the carrier 1 and the geometric projection of the third wire 12 onto the carrier 1 include an intersection. Comments made in connection with foregoing figures may also hold true for the device 1000. For example, the device 1000 may be similar to the device 400 described in connection with FIG. 4.

While a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific aspects shown and described without departing from the scope of the present invention. This application is intended to cover any adaptations or variations of the specific aspects discussed herein. Therefore, it is intended that this invention be limited only by the claims and the equivalents thereof.

What is claimed is:
1. A device, comprising:
a carrier;
a first semiconductor chip arranged over the carrier;
a first electrically conductive element arranged over the carrier;
a first wire electrically coupled to the first electrically conductive element; and
a second wire electrically coupled to the first electrically conductive element and to the first semiconductor chip, wherein the first electrically conductive element is configured to couple an electrical signal between the first wire and the second wire,
wherein the first electrically conductive element comprises a layer stack, wherein the layer stack comprises:
a first electrically conductive layer arranged over the carrier, and wherein the first electrically conductive layer is electrically coupled to the carrier;
an electrically insulating layer arranged over the first electrically conductive layer; and a second electrically conductive layer arranged over the electrically insulating layer, wherein a main surface of the second electrically conductive layer is electrically coupled to at least one of the first wire and the second wire, and wherein an area of the main surface of the second electrically conductive layer lies in a range from about 0.1 square millimeters to about 10 square millimeters.

2. The device of claim 1, wherein the first electrically conductive element is configured to receive the electrical signal from the first wire and forward the electrical signal to the second wire.

3. The device of claim 1, wherein the electrical signal is coupled between the first wire and the second wire such that a strength of the electrical signal or a shape of the electrical signal substantially unchanged.

4. The device of claim 1, further comprising a first contact element, wherein the first wire is electrically coupled to the first contact element.

5. The device of claim 1, further comprising:
a first contact element;
a second electrically conductive element arranged over the carrier; and
a third wire, wherein the first wire is electrically coupled to the second electrically conductive element, and the third wire is electrically coupled to the second electrically conductive element and the first contact element.

6. The device of claim 4, further comprising:
a second semiconductor chip arranged over the carrier;
a second contact element; and
a fourth wire electrically coupled to the second semiconductor chip and the second contact element.

7. The device of claim 6, wherein
a geometric projection of the first wire onto the carrier, a geometric projection of the second wire onto the carrier, and a geometric projection of the fourth wire onto the carrier are free of intersections; and
a geometric projection of a virtual straight line between the first contact element and the first semiconductor chip and the geometric projection of the fourth wire onto the carrier comprise an intersection.

8. The device of claim 1, wherein the first semiconductor chip comprises:
a surface facing away from the carrier; and
a gate electrode arranged over the surface, wherein the second wire is electrically coupled to the gate electrode.

9. The device of claim 6, wherein the second semiconductor chip comprises:
a surface facing away from the carrier; and
a source electrode arranged over the surface, wherein the fourth wire is electrically coupled to the source electrode.

10. The device of claim 1, wherein a thickness of the electrically conductive layer lies in a range from about 0.5 micrometers to about 50 micrometers.

11. The device of claim 1, wherein the first electrically conductive element comprises an adhesive material.

12. The device of claim 1, wherein the carrier comprises a die pad.

13. The device of claim 1, wherein the first electrically conductive layer, the second electrically conductive layer and electrically insulating layer have a similar foorprint.

14. A method, comprising:
arranging a semiconductor chip over a carrier;
arranging an electrically conductive element over the carrier;
electrically coupling a first wire to the electrically conductive element; and
electrically coupling a second wire to the electrically conductive element and the semiconductor chip, wherein the electrically conductive element is configured to forward an electrical signal between the first wire and the second wire,
wherein the electrically conductive element comprises a layer stack, wherein the layer stack comprises:
a first electrically conductive layer arranged over the carrier, wherein the first electrically conductive layer is electrically coupled to the carrier;
an electrically insulating layer arranged over the first electrically conductive layer; and
a second electrically conductive layer arranged over the electrically insulating layer, wherein a main surface of the second electrically conductive layer is electrically coupled to at least one of the first wire and the second wire, and wherein an area of the main surface of the second electrically conductive layer lies in a range from about 0.1 square millimeters to about 10 square millimeters.

15. A device, comprising:
a carrier;
a first semiconductor chip arranged over the carrier;
a second semiconductor chip arranged over the carrier;
an electrically conductive element arranged over the carrier;
a first contact element;
a second contact element;
a first wire electrically coupled to the electrically conductive element and the first contact element;
a second wire electrically coupled to the electrically conductive element and the first semiconductor chip; and
a third wire electrically coupled to the second semiconductor chip and the second contact element, wherein a geometric projection of the first wire onto the carrier, a geometric projection of the second wire onto the carrier, and a geometric projection of the third wire onto the carrier are free of intersections,
wherein a geometric projection of the electrically conductive element onto the carrier and the geometric projection of the third wire onto the carrier are free of the intersections, and
wherein a geometric projection of a virtual straight line starting at the first contact element and ending at the first semiconductor chip onto the carrier and the geometric projection of the third wire onto the carrier comprise an intersection.

16. The device of claim 15, wherein the electrically conductive element is configured to forward an electrical signal between the first wire and the second wire.

17. The device of claim 15, wherein the electrically conductive element is electrically insulated from the carrier.

18. A device comprising:
a carrier including a connection pad and first and second die pads;
a first vertical power semiconductor chip arranged over the first die pad of the carrier, the first chip comprising a first contact at a first main surface of the first chip facing the carrier, a second contact at a second main surface of the first chip opposite first main surface, and a third contact at the second main surface of the first chip, the third contact comprising a control contact;
a second vertical power semiconductor chip arranged over the second die pad of the carrier, the second chip comprising a first contact at a first main surface of the second chip facing the carrier, a second contact at a second main surface of the second chip opposite first main surface, and a third contact at the second main surface of the second chip, the third contact comprising a control contact;

a first wire electrically coupled between the third contact of the first chip and the connection pad of the carrier;

a second wire electrically coupled between the connection pad of the carrier and an external control terminal of the device; and a third wire starting at the third contact of the second chip and ending at the external control terminal of the device.

19. The device of claim 18, further comprising a fourth wire electrically coupled between the third contact of the second chip and the connection pad of the carrier.

* * * * *